United States Patent [19]

Kaneko et al.

[11] 3,711,792

[45] Jan. 16, 1973

[54] SOLID STATE OSCILLATOR HAVING SEMICONDUCTOR ELEMENTS MOUNTED IN A CAVITY RESONATOR

[75] Inventors: Yoichi Kaneko, Kokubunji-shi; Yukinari Fujiwara, Kodaira-shi; Katuhiro Kimura, Tokyo; Masao Kamimura, Kodaira-shi, all of Japan

[73] Assignees: Hitachi Ltd., Tokyo; Hitachi Electronics Company Limited, Kodaira-shi, Japan

[22] Filed: May 14, 1969

[21] Appl. No.: 824,614

[30] Foreign Application Priority Data

May 17, 1968 Japan ................................43/32889

Aug. 5, 1968 Japan ................................43/54916

[52] U.S. Cl.............331/96, 331/107 R, 331/107 G, 331/36 C, 332/30 V

[51] Int. Cl...............................................H03b 7/12

[58] Field of Search.........332/30 V, 52; 331/366, 96, 331/107 R, 107 A, 107 G, 107 S, 107 T, 177 V; 317/234

[56] References Cited

UNITED STATES PATENTS

| | | | |
|---|---|---|---|
| 3,065,432 | 11/1962 | Duncan | 331/107 T X |
| 3,524,149 | 8/1970 | Socci | 332/16 |
| 3,445,778 | 5/1969 | Gerlach | 331/96 |
| 3,141,141 | 7/1964 | Sharpless | 331/107 T |
| 3,254,309 | 5/1966 | Miller | 331/107 T X |
| 3,452,221 | 6/1969 | Gunn | 331/107 G X |
| 3,465,265 | 9/1969 | Kuru | 331/107 G X |
| 3,479,611 | 11/1969 | Sandbank et al. | 317/235 |

OTHER PUBLICATIONS

Lee et al., "Microwave Gunn Oscillator Tuned Electronically Over 1GHz," Electronic Letters June 14, 1968 Vol. 4 No. 12, pp. 240–242.

Guetin; "Gunn Effect With Two Samples in Parallel," Electronics Letters 23 Feb. 1968, Vol. 4, No. 4, pp. 63–64.

*Primary Examiner*—Alfred L. Brody

*Attorney*—Craig and Antonelli

[57] ABSTRACT

A solid state oscillator comprising a cavity resonator having an output portion, at least two semi-conductor elements disposed in an equi-phase plane of an electromagnetic field, and means for applying a bias voltage to each of said semiconductor elements.

8 Claims, 11 Drawing Figures

PATENTED JAN 16 1973

3,711,792

INVENTORS

YOICHI KANEKO, YUKINARI FUJIWARA,

KATUHIRO KIMURA and MASAO KAMIMURA

BY

Craig, Antonelli, Stewart & Hill

ATTORNEYS

INVENTORS
YOICHI KANEKO, YUKINARI FUJIWARA,
KATUHIRO KIMURA and MASAO KAMIMURA
BY
Craig, Antonelli, Stewart & Hill
ATTORNEYS

SOLID STATE OSCILLATOR HAVING SEMICONDUCTOR ELEMENTS MOUNTED IN A CAVITY RESONATOR

BACKGROUND OF THE INVENTION

1. Field of the Invention

This invention relates to a solid state oscillator, and more particularly it pertains to a solid state oscillator including at least two semiconductor elements contained in a cavity resonator.

2. Description of the Prior Art

By using a solid state oscillator element as power source, it is impossible to obtain such a sufficient output as obtained by the use of an electron tube or the like. The main reason for this is that limitation is laid upon an input power which can be safely imparted to the crystal element per se. However, it is possible to increase the output to a certain extent by increasing the input power, with the construction designed so that Joule heat occurring therein can be sufficiently dissipated. Conventionally, there have been proposed several methods. One of the conventional methods is to provide a member of diamond or the like having a high heat conductivity between the heat sink and the crystal element to thereby improve the efficiency. By such method, however, it is impossible to greatly increase the upper limit of input to the crystal element since the size of the crystal element itself is limited from the nature of the solid state oscillator element. Another one of the conventional methods is to minimize the thickness of the crystal element for achieving effectively heat dissipation. However, merely making the element thin cannot be said to be an effective countermeasure since the element thickness is limited by the frequency of oscillation. Another output improving method is to increase the Q of a resonator on which the element is mounted and sufficiently adjust the coupling between the resonator and a load. By doing so, the efficiency can be somewhat improved. However, this is by no means a basic countermeasure. At the present time, therefore, it is very difficult to produce a high output by utilizing only one solid state oscillator element.

Furthermore, a frequency controllable solid state oscillator is well known in the art wherein a variable capacitance element such for example as varactor diode is provided in the resonance circuit thereof and the oscillation frequency is varied by electrically changing the electrostatic capacitance of the element.

Still furthermore, there has also been proposed a solid state oscillator of the type in which an oscillating element and variable capacitance element are provided in a coaxial resonator or cavity resonator which are available as resonance circuit with a minimum loss at high frequencies. In such solid state oscillator, a DC bias voltage applied to the variable capacitance element is varied in accordance with a desired input signal for example so that the oscillation frequency is varied correspondingly, with a result that there is produced an output which is frequency-modulated with the input signal. It is also possible to effect automatic frequency control (AFC) by detecting variations in the output frequency of the oscillator and feeding the detecting signal back to the variable capacitance element as DC bias voltage.

The aforementioned conventional solid state oscillator represents relatively satisfactory tuning characteristics by capacitance variations of the variable capacitance element in a particular frequency range (referred to simply as electronic tuning characteristics), but it is disadvantageous in that when the variable frequency range of the oscillator is very wide, the satisfactory electronic tuning characteristics tend to be lost and the oscillation output is remarkably changed. Therefore, in the case where such a solid state oscillator is used as an oscillator for frequency-modulation, the frequency modulation sensitivity thereof is reduced, and in the case where it is employed as an oscillator provided with an AFC function, the AFC effect thereof is decreased. Another disadvantage is that much difficulty is experienced in the adjustment for matching the oscillator to a load. Thus, the conventional solid state oscillator cannot be stably operated over a wide range, and therefore it has heretofore been applied only to limited applications in spite of the fact that the oscillator can be miniaturized and the power source device therefor can be simplified in construction.

SUMMARY OF THE INVENTION

An object of the present invention is to provide a solid state oscillator wherein a plurality of semi-conductor elements mounted in a cavity resonator can be effectively operated.

Another object of the present invention is to provide a solid state oscillator which is capable of providing a high output power.

A further object of the present invention is to provide a solid state oscillator which is so adapted to stably operate by maintaining the ratio of the change of oscillation frequency and the capacitance change of the variable capacitance element substantially constant over a wide range of the oscillation frequency.

A still further object of the present invention is to provide a solid state oscillator adapted to provide an output which remains substantially unchanged over a wide electronic tuning range.

In order to achieve the foregoing objects, in accordance with the present invention, a plurality of semiconductor elements are disposed in an equi-phase plane of an electromagnetic field occurring in a resonator, whereby the ratio of high frequency voltages acting on the respective elements can be maintained substantially constant irrespective of variations in the oscillation frequency. Thus, it is possible to obtain an oscillation output which remains constant over a wide range, and stabilized operation can be maintained.

Other objects, features and advantages of the present invention will become apparent from the following description taken in conjunction with the accompanying drawings.

DESCRIPTION OF THE PREFERRED EMBODIMENTS:

Among solid state oscillating elements are Gunn diodes, IMPATT (impact avalanche and transit time) diodes, LSA (limited space charge accumulation) diodes and so forth. The present invention is applicable to any of these diodes, but it will be described herein as applied to the use of the Gunn diode.

Figure 1A:
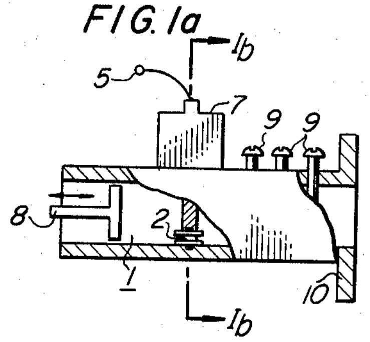
FIGS. 1*a* and 2*a* are sectional side views showing the solid state oscillators according to first and second embodiments of the present invention respectively.
Figure 1B:
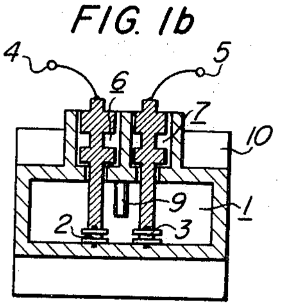
FIGS. 1*b* and 2*b* are sectional views taken along the lines I*b* — I*b* and II*b* — II*b* of FIGS. 1*a* and 2*a*, respectively.

Referring first to FIGS. 1*a* and 1*b* numeral 1 represents a cavity resonator, 2 and 3 Gunn diodes respectively, 4 and 5 terminals for applying a DC bias voltage to the gun diodes 2 and 3 respectively, and 6 and 7 high frequency chokes which prevent leakage of high frequency energy and permit the passage of the DC voltage to the Gunn diodes 2 and 3 therethrough respectively. The cavity resonator 1 includes a frequency adjusting portion constituted by a movable shorting plate 8, and a stub adjusting portion constituted by three screws 9 and a flange 10 to be coupled to an external circuit.

In the foregoing arrangement, the two Gunn diodes 2 and 3 are located in an equi-phase plane of a standing wave occurring in the cavity resonator 1 such, for example, as a plane perpendicular to the axial direction of the resonator 1 (the axial direction of a waveguide part of which constitutes the cavity resonator 1). By doing so, the ratio of high frequency voltages acting on the diodes remains substantially unchanged irrespective of variations in the frequency. Thus, the respective diodes are made to oscillate under an optimum operating condition, resulting in an enhanced efficiency. Such an arrangement is suitable for parallel operation. The stub adjusting portion 9 is provided for the purpose of adjusting the coupling between the external load circuit and the resonance circuit. In order to efficiently take out the oscillation output of the mounted diodes 2 and 3, it is required that the load of the circuit as viewed from the diodes 2 and 3 be of a suitable value. This can be achieved by selecting the position of the movable short-circuit plate 8 relative to the mount portion for the diodes 2 and 3 and by means of the stub adjusting portion. Adjustment of the oscillation frequency is also carried out by moving the movable short-circuit plate 8 which is spaced apart from the diodes 2 and 3 a distance corresponding approximately to one-fourth of a guide wavelength. In an attempt to greatly change the oscillation frequency, the stub adjusting portion 9 is also adjusted to thereby adjust the high frequency voltages acting on the diodes 2 and 3.

In the foregoing, description has been made of the case where the two Gunn diodes are located inside the resonator 1. However, it is possible that more than two Gunn diodes may be provided inside the resonator 1 to obtain a greater output.

Figure 2A:
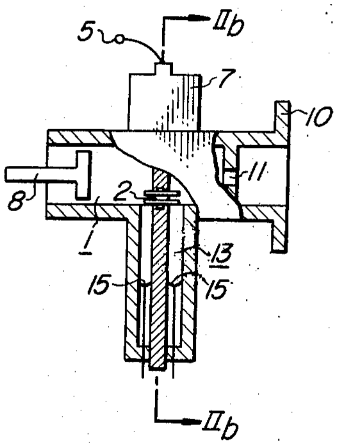
Figure 2B:
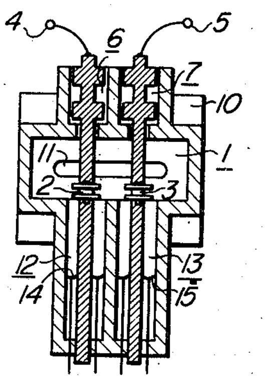

FIGS. 2*a* and 2*b* show a second embodiment of the present invention, wherein parts corresponding to FIGS. 1*a* and 1*b* are indicated by like numerals. Numeral 11 denotes an output window, and 12 and 13 variable reactance circuits including short plungers 14 and 15 respectively. According to this embodiment, it is possible to mechanically adjust the ratio of high frequency voltages acting on the diodes 2 and 3, that is, the reactances connected in series thereto are changed by moving the short plunger 14 or 15, so that the ratio of the high frequency voltage acting on these diodes can be changed freely. Thus, even in case there is some dispersion in the characteristics of the diodes in use so that high frequency voltages for an optimum operating condition are somewhat differentiated from each other, the optimum operation can be performed. Only one such variable reactance circuit may be provided.

Experimentally, it has been found that the sum of the outputs of the two Gunn diodes mounted in the aforementioned resonator can be supplied to the external circuit, that the oscillation frequency assumes a desired value during the rated operation, and that parallel operation can easily be performed. The oscillation spectrum of the parallel operation is substantially the same as that of only one gun diode. On the other hand, there is a tendency that a slightly increased amount of noise occurs, but this constitutes no critical problem as the present oscillator is utilized as general power source.

The present invention will now be described as applied to a frequency controllable solid state oscillator.

Figure 3A:
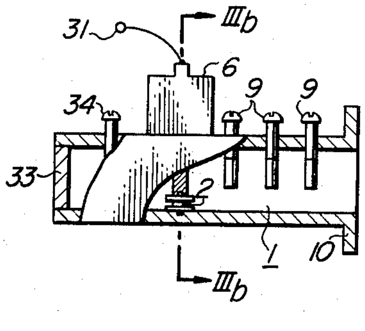
FIG. 3*a* is a sectional side view showing the solid state oscillator according to a third embodiment of the present invention.
Figure 3B:
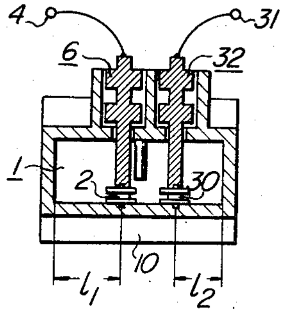
FIG. 3*b* is a sectional view taken along the line III*b* — III*b* of FIG. 3*a;*

FIGS. 3*a* and 3*b* show a third embodiment of the present invention, wherein parts corresponding to FIGS. 1*a* and 1*b* are indicated by like reference numerals. Numeral 30 represents a varactor diode, 31 a terminal for applying a DC bias voltage to the varactor diode 30, 32 a high frequency choke, 33 a shorting plate, and 34 a frequency adjusting screw.

In the foregoing arrangement, the Gunn diode 2 and varactor diode 30 are located in an equi-phase plane of a standing wave occurring in the cavity resonator 1, as in the first and second embodiments. The resonator 1 includes a frequency adjusting portion 34 constituted by a single screw provided at a position spaced apart from the shorting plate 33 by a distance corresponding to $\frac{1}{4}\lambda_g$ ($\lambda_g$: guide wavelength) and a stub adjusting portion 9 constituted by three screws. By manipulating the frequency adjusting portion 34, the capacitance of the resonator is changed so that the oscillation frequency can be greatly changed. The stub adjusting portion 9 is provided for the purpose of achieving matching between the oscillator and an external load connected therewith through the flange 10. In order to effectively take out the oscillation output of the Gunn diode, it is required that the load of the circuit as viewed from the Gunn diode be maintained substantially constant. This can be achieved by suitably selecting the position of the shorting plate 2 and adjusting the stub adjusting portion 9. The circuit impedance as viewed from the gun diode can be adjusted by changing the length $l_1$ shown in FIG. 3*b*. In the case of $TE_{10}$ mode, the potential distribution in the resonator is such that the potential is the highest at the center of the resonator and becomes lower toward the wall portion thereof. Thus, the shorter the length $l_1$, the lower the high frequency voltage acting on the Gunn diode and the circuit impedance as viewed from the Gunn diode. Obviously, the high frequency voltage acting on the varactor diode 30 is also decreased by reducing the length $l_2$. The lengths $l_1$ and $l_2$ are determined to be of a required value in designing the resonator.

Description will now be made of the operation performed by applying the predetermined bias voltage to both the Gunn diode 2 and varactor diode 30.

As well known in the art, the Gunn diode is a negative resistance element utilizing the nature of a compound semiconductor that current oscillation is produced when an electric field therein exceeds a predetermined level. For example, in the case of a 13 GHz oscillating element, under a desired load condition for the resonance circuit, oscillation is initiated when the bias voltage applied to the Gunn diode 3 is 4 V, and the oscillation output becomes maximum when the bias voltage is 8 V. The varactor diode which is used as variable capacitance element is negatively biased to thereby finely change the oscillation frequency of the oscillator. The high frequency circuit theory shows that a change in the resonance frequency of the resonator with a fine variation in the electrostatic capacitance of the varactor diode depends upon the ratio of the overall high frequency energy stored in the resonance circuit and the high frequency energy stored in the infinitesimal capacitance. Thus, the rate of change of the oscillation frequency of the oscillator with respect to a change in the bias voltage (for example, the frequency-modulation sensitivity when the oscillator is used as one for frequency-modulation, and AFC sensitivity when it is used as oscillator provided with an AFC function) can be increased by increasing the high frequency voltage acting on the varactor diode. By increasing the high frequency voltage acting on the varactor diode, however, the power loss of the varactor diode is also increased. Therefore, the voltage is set to a desired level taking into consideration the oscillation output. This can be determined by the length $l_2$, as described above. Thus, with the arrangement according to the present invention, the ratio of the high frequency voltages acting on the Gunn diode and varactor diode can be maintained substantially constant. Consequently, the ratio of a variation of the oscillation frequency of the oscillator and a variation of the bias voltage remains substantially constant over a wide frequency range, so that the operation can be stably performed. In an attempt to greatly change the oscillation frequency mechanically by manipulating the frequency adjusting portion 34, the oscillation output is adjusted to the optimum condition by means of the stub adjusting portion 9. At this point, the electronic tuning characteristic of the varactor diode is also adjusted to the optimum condition since the varactor diode is located in the same equi-phase plane of the electromagnetic field as the Gunn diode as described above. Thus, the adjustment of this type of oscillator can be greatly facilitated.

Figure 4:
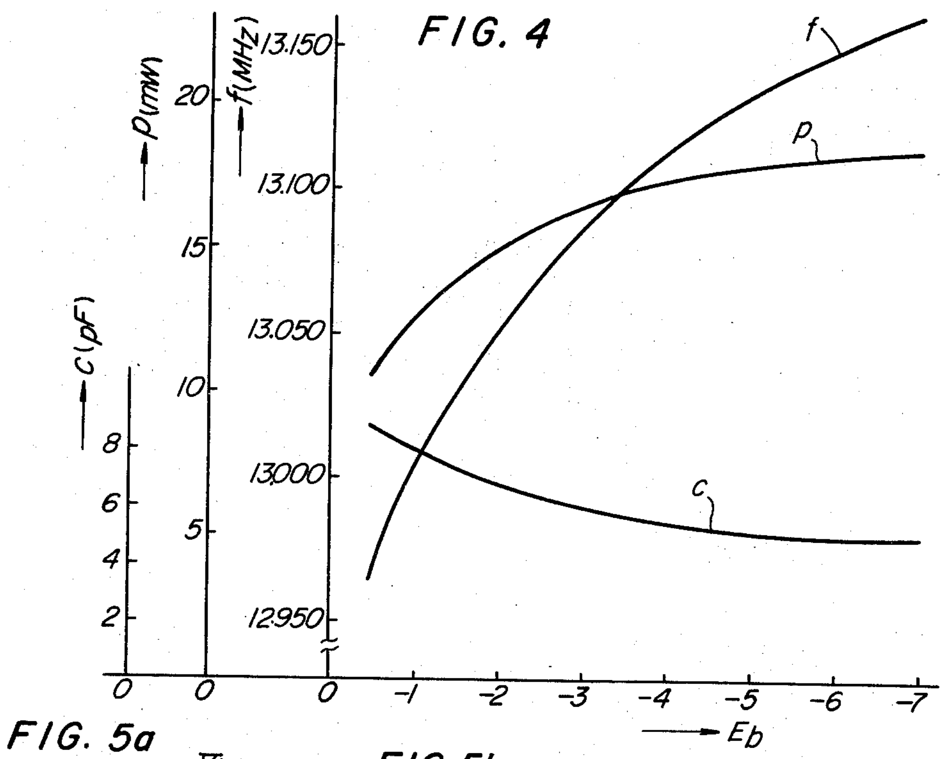
FIG. 4 is a view showing the operational characteristics of the oscillator shown in FIG. 3*a;*

FIG. 4 shows the operational characteristics of an oscillator embodying the present invention, wherein there are shown characteristic curves representing the relationships between the capacitance C(ₚF) of the varactor diode, oscillation output P (mW) of the oscillator and oscillation frequency $f$ (MHz) and the bias voltage $E_b$ applied to the varactor diode. The cross-sectional area of the resonator is 20 mm × 5 mm, the voltage applied to the Gunn diode 7.75 (V), and current 365 mA. From this figure, it will be seen that the electronic tuning range is as wide as about 180 MHz, and that there occurs less output variation. The mechanically variable frequency range was ± 1 GHz or wider.

Figure 5A:
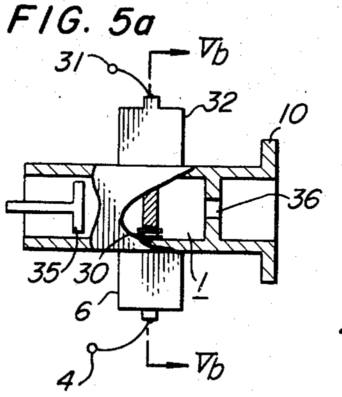
FIGS. 5*a* and 6*a* are sectional side views showing the solid state oscillator according to fourth and fifth embodiments of the present invention respectively.
Figure 5B:
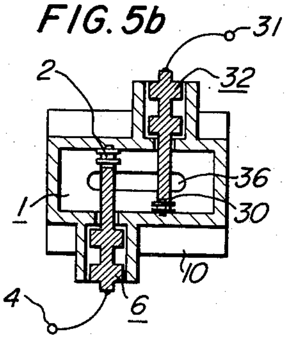
FIGS. 5*b* and 6*b* are sectional views taken along the lines V*b* — V*b* and VI*b* — VI*b* of FIGS. 5*a* and 6*a* respectively.

FIGS. 5*a* and 5*b* show the construction of the solid state oscillation according to a fourth embodiment of the present invention wherein parts corresponding to FIGS. 3*a* and 3*b* are indicated by like numerals. Numeral 35 represents a frequency adjusting piston, and 36 a coupling window. In the present embodiment, high frequency chokes 6 and 32 are provided respectively in the top and bottom portions of the resonator 1 so that the diameter of each of these chokes can be increased. As will be readily apparent to those skilled in the art, it is possible that the frequency adjusting piston 35 may be replaced with the frequency adjusting screw 34 or that the coupling window 36 may be substituted by the stub adjusting portion 9. Thus, various combinations will become possible.

Figure 6B:
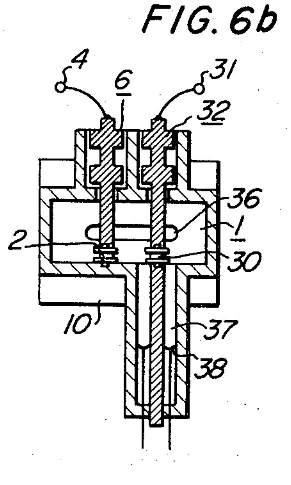
Figure 6A:
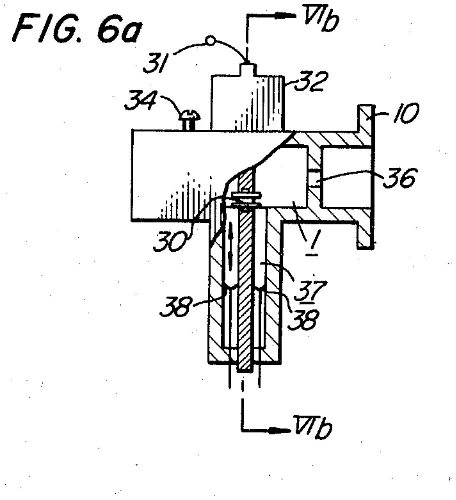

FIGS. 6*a* and 6*b* show the solid state oscillator according to a fifth embodiment of the present invention, wherein parts corresponding to FIGS. 3*a* and 3*b* and FIGS. 5*a* and 5*b* are indicated by like numerals. Numeral 37 denotes a variable reactance circuit, and 38 a short plunger. In the aforementioned, third and fourth embodiments, it is impossible to change the ratio of high frequency voltages acting on the Gunn diode and varactor diode after the oscillator has been assembled, since it depends upon the lengths $l_1$ and $l_2$ (FIG. 3). In contrast, according to the present embodiment, the variable reactance circuit 37 is connected in series with the varactor diode 30, so that the reactance connected in series with the varactor diode can be changed by shifting the position of the short plunger 38 in a direction as indicated by an arrow mark. Thus, the ratio of high frequency voltages acting on the Gunn diode and varactor diode can be adjusted as desired, since the magnitude of the high frequency voltage applied across the varactor diode 30 can be changed. Consequently, the oscillation output and the rate of change of the oscillation frequency with respect to the variation of capacitance of the varactor diode can be freely adjusted. Furthermore, it is also easy to connect the variable reactance circuit in series with the Gunn diode. Still furthermore, the frequency adjusting screw 34 and coupling window 36 may be replaced by the piston 35 and stub adjusting portion 9 as shown in FIGS. 3*a* and 5*a* respectively.

Although, in each of the foregoing embodiments, a single oscillating element and a single variable capacitance element were provided, it is also possible that plural such elements may be provided.

Furthermore, although in each of the foregoing embodiments a plurality of semiconductor elements were located in an equi-phase plane of an electromagnetic field, i.e., a plane perpendicular to the axis of the resonator, a deviation between the positions of the elements with respect to the axis of the resonator is allowable within such a range that the ratio of high frequency voltages acting on the semiconductor elements is not greatly changed when the frequency is changed. More specifically, the purpose intended by the present invention can be substantially achieved in so far as the spacing between the semiconductor elements with respect to the axis of the resonator is ⅛ $\lambda_g$ or less ($\lambda_g$ : guide wavelength) that is the phase difference is 45° or less. Needless to say, the smaller the spacing, the more remarkable the effect. In the respective embodiments described above, a portion of a rectangular waveguide was utilized, but use may also be made of a waveguide of circular, elliptical or any other shape to produce effect similar to the above.

As described above, the solid state oscillator according to the present invention operates very stably since the ratio of high frequency voltages acting on respective semiconductor elements can be maintained substantially constant irrespective of frequency variations. Furthermore, it is adapted for efficient parallel operation of plural oscillating elements to obtain a high output, and it can be satisfactorily operated by the adjustment of peripheral circuits even if the characteristics of the plural elements are not uniform. Still furthermore, with the solid state oscillator embodying the present invention, a wider electronic tuning range can be realized with a slight output variation.

The aforementioned embodiments are described only for the illustrative purpose, and the present invention is by no means limited to such particular embodiments. Various modifications and changes are possible without departing from the scope and spirit of the present invention.

We claim:

1. A solid state oscillator comprising a rectangular cavity resonator having an output portion, at least two semiconductor elements inserted in said cavity resonator, and means for applying a bias voltage to each of said semiconductor elements, said semiconductor elements being spaced apart from each other and located in parallel in a plane perpendicular to the axis of said cavity resonator, thereby making substantially constant the ratio of high frequency voltages acting on said semiconductor elements irrespective of variations in the oscillation frequency.

2. A solid state oscillator according to claim 1, wherein all of said semiconductor elements are negative resistance oscillating elements.

3. A solid state oscillator according to claim 2, wherein a variable inductance circuit is connected in series with at least one of said negative resistance oscillating elements, thereby adjusting the ratio of high frequency voltages acting on said oscillating elements.

4. A solid state oscillator according to claim 1, wherein at least one of said semiconductor elements is a negative resistance oscillating element, and at least one of said semiconductor elements is a variable capacitance element.

5. A solid state oscillator according to claim 4, wherein a variable inductance circuit is connected in series with at least one of said negative resistance oscillating element and said variable capacitance element.

6. An oscillator according to claim 1, further including a plurality of plungers displaceable in directions parallel to the plane of said elements for adjusting the ratio of the high frequency voltages acting on the elements.

7. An oscillator according to claim 3, wherein said inductive circuit comprises a pair of inductive coils coaxially mounted with respect to each of said elements in said plane of said elements.

8. An oscillator according to claim 7, further including a plurality of plungers displaceable in directions parallel to the plane of said elements for adjusting the ratio of the high frequency voltages acting on the elements.

* * * * *